United States Patent
Bautista et al.

(10) Patent No.: US 10,194,194 B2
(45) Date of Patent: Jan. 29, 2019

(54) TUNER CIRCUIT WITH ZERO POWER LOOP THROUGH

(71) Applicant: ALi Corporation, Hsinchu (TW)

(72) Inventors: Alfredo Bautista, Geneva (CH); Claude-Alain Gobet, Geneva (CH); Christian Marc Eichrodt, Geneva (CH)

(73) Assignee: ALi Corporation, Hsinchu (TW)

( * ) Notice: Subject to any disclaimer, the term of this patent is extended or adjusted under 35 U.S.C. 154(b) by 0 days.

(21) Appl. No.: 15/596,805

(22) Filed: May 16, 2017

(65) Prior Publication Data

US 2018/0338176 A1  Nov. 22, 2018

(51) Int. Cl.
  *H04N 21/426*  (2011.01)
  *H03H 7/06*    (2006.01)
  *H03J 5/02*    (2006.01)
  *H04N 21/438*  (2011.01)

(52) U.S. Cl.
  CPC ......... *H04N 21/4263* (2013.01); *H03H 7/06* (2013.01); *H03J 5/02* (2013.01); *H04N 21/4383* (2013.01)

(58) Field of Classification Search
  USPC .................................................. 348/731–733
  See application file for complete search history.

(56) References Cited

U.S. PATENT DOCUMENTS

| 3,831,095 | A  | * | 8/1974  | Mounce ............... H04B 7/12 455/140 |
| 5,349,391 | A  | * | 9/1994  | Spiero ............... H04N 5/765 307/115 |
| 6,588,017 | B1 | * | 7/2003  | Calderone ........... H04N 7/106 348/E5.005 |
| 6,622,307 | B1 | * | 9/2003  | Ho .................. H04N 7/104 348/E7.05 |
| 6,822,510 | B1 | * | 11/2004 | Baker ................ H03F 1/565 330/104 |
| 6,915,529 | B1 | * | 7/2005  | Suematsu ........... H04H 20/63 348/E7.05 |
| 8,983,398 | B2 |   | 3/2015  | Chang et al. |
| 9,883,236 | B2 | * | 1/2018  | Kang ............... H04N 21/4436 |
| 2002/0196843 | A1 | * | 12/2002 | Ben-Bassat .......... H04B 1/38 375/219 |
| 2003/0035070 | A1 | * | 2/2003  | Fanous ............. H03F 3/45183 348/707 |

(Continued)

*Primary Examiner* — An Son P Huynh
(74) *Attorney, Agent, or Firm* — J.C. Patents

(57) ABSTRACT

The disclosure provided a tuner circuit having a zero power loop through (ZPLT) circuit that is capable of providing a loop through path even when no power is being supplied or without a standalone power supply. The tuner circuit includes an input terminal, an output terminal, a ZPLT circuit, and an internal resistor. The input terminal receives a radio frequency (RF) signal. The output terminal is connected to a subsequent tuner. The ZPLT is connected between the input terminal and the output terminal. The internal and an external resistor connected between the tuner circuit and subsequent tuner form a voltage divider to divide a bias found at the output terminal to enable the ZPLT circuit for providing a loop through path to deliver the RF signal to the output terminal when the tuner circuit is not powered by a standalone power or a low noise amplifier is enabled.

19 Claims, 3 Drawing Sheets

(56) References Cited

U.S. PATENT DOCUMENTS

| | | | |
|---|---|---|---|
| 2003/0115588 A1* | 6/2003 | Hoshino | H04B 1/18 725/9 |
| 2006/0099906 A1* | 5/2006 | Bae | H04H 40/90 455/3.02 |
| 2006/0128328 A1* | 6/2006 | Shah | H03H 7/38 455/178.1 |
| 2008/0297661 A1* | 12/2008 | Kitaguchi | H04B 1/28 348/705 |
| 2009/0027145 A1* | 1/2009 | Lim | H03J 1/0083 334/11 |
| 2009/0079881 A1* | 3/2009 | White | H04B 1/18 348/731 |
| 2010/0134219 A1* | 6/2010 | Luo | H03J 3/185 334/78 |
| 2011/0001877 A1* | 1/2011 | Pugel | H03H 7/463 348/565 |
| 2011/0163612 A1* | 7/2011 | Zhan | H03H 5/12 307/109 |
| 2012/0140122 A1* | 6/2012 | Lai | H04B 1/18 348/707 |
| 2013/0285471 A1* | 10/2013 | Ren | H04B 15/02 307/113 |
| 2015/0372704 A1* | 12/2015 | Nakajima | H03L 7/24 455/196.1 |
| 2016/0127773 A1* | 5/2016 | Kang | H04H 20/08 348/730 |

* cited by examiner

TUNER CIRCUIT WITH ZERO POWER LOOP THROUGH

BACKGROUND

Technical Field

The invention relates a tuner circuit, and more particularly, relates to a tuner circuit having a zero power loop through function.

Description of Related Art

In a video broadcasting system, RF signals are being received by a TV tuner circuit, or a set-top box (STB), where the received RF signals are converted by the TV tuner circuit and displayed on a display. Nowadays, the TV tuner circuits are geared with a loop-through function for bypassing the RF signal received from an external source to a subsequent TV tuner. There are various ways to implement such loop-through function, such as active loop-through circuit integrated in the TV tuner circuit or a standalone loop-through circuit external to the TV tuner.

One of the problems with the active loop-through circuit is a requirement of internal power, so that the active loop-through circuit may be powered for providing the loop-through function to the received RF signal. If a first TV tuner circuit receiving the RF signal from the provider is not powered or plugged in to a powersource (e.g., wall outlet or a standalone power supply), no internal power would be generated to power the active loop-through circuit as to provide such loop-through function. On the other hand, passive loop-though circuit was developed to get around this problem of no internal power. However, so far the passive loop-through circuit is standalone unit external to the TV tuner circuit, which presents additional cost, parts, etc.

Nothing herein should be construed as an admission of knowledge in the prior art of any portion of the present invention. Furthermore, citation or identification of any document in this application is not an admission that such document is available as prior art to the present invention, or that any reference forms a part of the common general knowledge in the art.

SUMMARY

The disclosure is directed to a radio frequency (RF) receiver and a method of processing the RF signal, which reduces the current consumption while waiting for data packet to arrive.

In one of the exemplary embodiments, a tuner circuit includes an input terminal, an output terminal, a loop through circuit, and an internal resistor. The input terminal receives a radio frequency signal. The output terminal connects to a subsequent turner circuit and outputs the radio frequency signal to the subsequent tuner circuit. The loop through circuit is connected between the input terminal and the output terminal. The internal resistor is connected between the output terminal and a ground terminal. The internal resistor and an external resistor connected between the tuner circuit and subsequent tuner forms a voltage divider to divide a bias provided by the subsequent tuner circuit, and the divided bias enables the loop through circuit for providing a loop through path to deliver the radio frequency signal from the input terminal to the output terminal according to a power status and configuration of the tuner circuit.

In one of the exemplary embodiments, a loop through circuit, adapted to a turner, includes an input terminal, an output terminal, a logic control, and a switch. The input terminal receives a radio frequency signal. The output terminal outputs the radio frequency signal to an external circuit. The logic control is connected to the output terminal to receive a bias through the resistor, and outputting a control signal according to a power status and configuration of the tuner. The switch is connected between the input terminal and the output terminal, and provides a loop through path for the radio frequency signal from the input terminal to be delivered to the output terminal according to the control signal.

In one of the exemplary embodiments, a video broadcasting system includes a first tuner and a second tuner. The first tuner receives a radio frequency signal from a transceiver. The first tuner includes a loop through circuit having a first terminal and a second terminal, where the loop through circuit delivers the radio frequency signal received from the first terminal to the second terminal. The second tuner is connected to the second terminal to receive the radio frequency signal. The loop through circuit of the first tuner is powered by the second tuner.

To make the above features and advantages of the disclosure more comprehensible, several embodiments accompanied with drawings are described in detail as follows.

It should be understood, however, that this summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
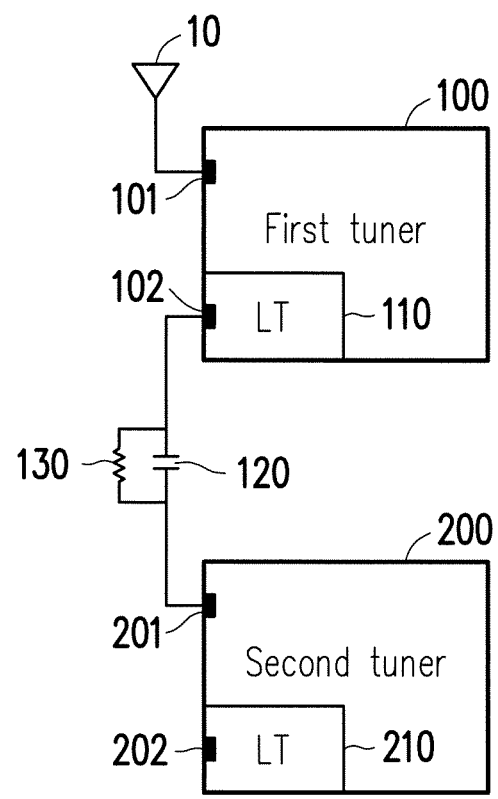
FIG. 1 is a block diagram illustrating a broadcasting system 1 according to one of the exemplary embodiments of the disclosure.

Reference will now be made in detail to the present preferred embodiments of the invention, examples of which are illustrated in the accompanying drawings. Wherever possible, the same reference numbers are used in the drawings and the description to refer to the same or like parts.

As described above, a loop-through function of a tuner circuit requires internal power or a standalone power source as to power the circuitry or logic that provides the function. If a first tuner receiving a RF signal from an antenna is not powered or unplugged from the wall outlet, a second tuner subsequent to the first tuner would not be able to receive the RF signal through the first tuner.

Exemplary embodiments are described below to illustrate a tuner circuit having a loop through circuit (also referred to as zero power loop through circuit, ZPLT circuit) that does not require the first tuner to be powered as to loop through the received RF signal to the subsequent second tuner. The exemplary embodiments utilize a bias found in a second tuner subsequent to the first tuner to enable the loop through circuit of the first tuner. In one of the embodiment, loop through function is provided through additional elements of an external resistor coupled between the first tuner and the second turner. The external resistor is connected in parallel with a capacitor. While the capacitor allows the RF signal to pass, the resistor provides a path for the bias found at the input terminal of the second tuner to power the loop through circuit of the first tuner. In detail, the external resistor and an internal resistor form a voltage divider to divide bias obtained at the input of the second tuner to power or enable a logic control of the loop through circuit. Even when the first tuner is not powered or a low noise amplifier of the first tuner is enabled, the logic control would have sufficient power to turn on a switch to provide the loop through path which delivers the RF signal to the second tuner.

FIG. 1 is a block diagram illustrating a broadcasting system 1 according to one of the exemplary embodiments of the disclosure. With reference to FIG. 1, the broadcasting system 1 includes an antenna 10, a first tuner 100, and a second tuner 200. An external resistor 130 and a capacitor 120 are connected in parallel, and the external resistor 130 and a capacitor 120 are connected between the first tuner 100 and second tuner 200. The first tuner 100 includes an input terminal 101, a loop through circuit 110, an output terminal 102. The second tuner 200 includes an input terminal 201, a loop through circuit 210 and an output terminal 202. In the exemplary embodiment, the first and second tuners 100, 200 are daisy chained. In other embodiments, the second tuner 200 may also be connected to other subsequent tuners to loop through the received RF signal via the output terminal 202. It should be noted that the exemplary embodiment is not intended to limit the structure of the second tuner 200. In one of the embodiments, the second tuner 200 may be a simplified tuner that does not include the loop through circuit 210 and the output terminal 202.

In the operation of the broadcasting system 1, the antenna 10 receives a radio frequency (RF) signal and inputs the RF signal to the first tuner 100 via an input terminal 101. On the other hand, the first tuner 100 bypasses the RF signal received from the antenna 10 via the loop through circuit 110 to the second tuner 200. In the exemplary embodiment, both of the first and second tuners 100, 200 may process the received RF signal and display information carried by the RF signal. For example, the first and second tuners 100, 200 may be connected to a television (or embedded in a television), computer, mobile phone, or any electronic devices having display function. The information carried by the RF signal may be displayed on the electronic devices respectively connected to the first and second tuners 100, 200.

In the exemplary embodiment, the RF signal may have frequency band of 950 MHz to 2.15 GHz, which is directed to a satellite receiver. However, the exemplary embodiment is not intended to limited the frequency band of the RF signal. In other embodiments, RF signals having different frequency band may also utilize the loop through circuit depicted above to bypass a received RF signal to a subsequent device.

In the following, the detail of the loop through circuit 110 and the loop through function of the first tuner 100 would be described. The loop through circuit 210 of the second tuner 200 would have similar structure and function as the loop through circuit 110 of the first tuner 100, which may be deduced from the loop through circuit 110. Thus, the description of the loop through circuit 210 would be omitted below for the brevity.

Figure 2:
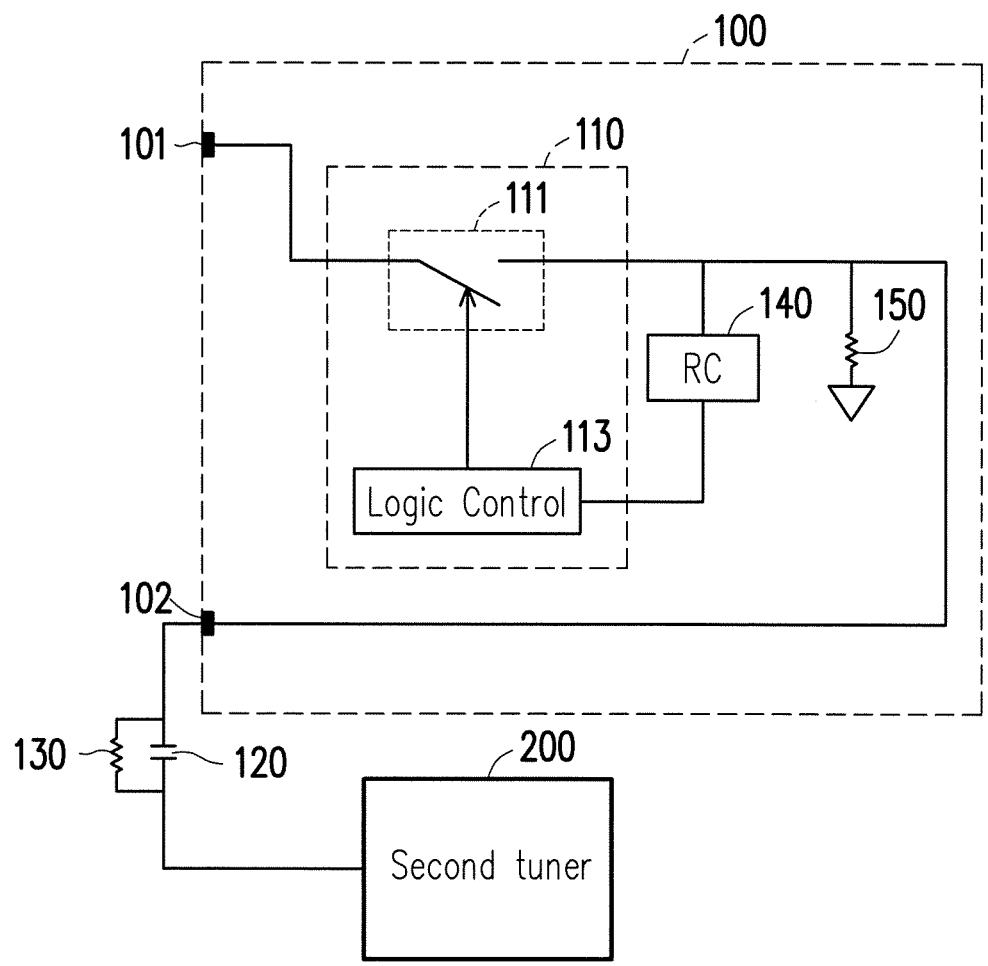
FIG. 2 is a block diagram illustrating the first tuner 100 according to one of the exemplary embodiments of the disclosure.

FIG. 2 is a block diagram illustrating the first tuner 100 according to one of the exemplary embodiments of the disclosure. With reference to FIG. 2, the first tuner 100 includes a loop through circuit 110, an internal resistor 150 connected between the output terminal 102 and a ground terminal, and a RC filter 140. A capacitor 120 and an external resistor 130, connected in parallel, are connected between the first turner 100 and the second tuner 200. The loop through circuit 110 is connected between the input terminal 101 and the output terminal 102. The external resistor 130 and the internal resistor 150 form a voltage divider to divide a bias provided by the second turner 200. The divided bias is used to enable the loop through circuit 110 for providing a loop through path to deliver the radio frequency signal from the input terminal 101 to the output terminal 102 according to a power status and a configuration of the tuner circuit 100.

In the exemplary embodiment, when the first turner 100 is not powered by a standalone power supply or a low noise amplifier (not shown in FIG. 2, and shown in FIG. 3) of the first tuners 100 is enabled, the loop circuit 110 is enabled by the divided bias. In other words, when the first turner 100 is not powered by the standalone power supply or the low noise amplifier is disabled, the loop through circuit 110 of the first tuner 100 is powered or enabled by the second tuner 200. In such configuration, the function of the loop through circuit 110 may be maintained even when the first tuner 100 is completed powered off, or unplugged from the standalone power supply. In detail, the bias received from the second tuner 200 may be delivered to the loop through circuit 110 through the voltage divider (the internal resistor 150 and the external resistor 130). The voltage divider divide the bias received from the output terminal 102 to a small current to power a logic control of the loop through circuit 110 as to turn on a switch for creating a loop through path (ex: from the input terminal 101 to output terminal 102 through the loop through circuit 110). The detail of logic control and switch would be described later.

On the other hand, when the loop through circuit 110 is enabled, the received RF signal is conveyed to the loop through circuit 110 to the second tuner 200 form the loop through path. In detail, the loop though circuit 110 bypasses and feeds the RF signal through the capacitor 120. The capacitor 120 allows the RF signal to travel to the output terminal 102 connected to the second tuner 200 subsequent to the first tuner 100. Based on the above, the loop through path is established allowing the RF signal received from the input terminal 101 to be looped through to the second tuner 200 while using the divided bias obtained from the second tuner 200 as an operational power for the through loop circuit 110 when the standalone power supply is not available.

The RC filter 140 is coupled between the loop though circuit 110 and the output terminal 102 to prevent the RF signal from feeding back to the loop though circuit 110. Further, the RC filter is further used to filter out specific frequency band of a signal which is usually used to control an external circuit coupled to the input terminal 101. In the exemplary embodiment, the external circuit is a low noise block down-converter (LNB) outside the first turner 100. In the exemplary embodiment, the loop though circuit 110 may be implemented in a low-cost COMS technology.

With reference to FIG. 2 again, the loop though circuit 110 includes a switch 111 and a logic control 113. The switch 111 is connected to the input terminal at one end for receiving the RF signal and connected to the output terminal 102 for feeding the RF signal to the second tuner 200. In the exemplary embodiment, when the switch 111 is turned on, the loop through path is established (enabled) between the input terminal 101 and the output terminal 102. When the switch 111 is turned off, the loop through path is disabled.

The logic control 113 is connected to the output terminal to receive the divided bias provided by the second tuner 200 via the external resistor 130 and the internal resistor 150. As mentioned above, the bias provided by the second tuner 200 is divided and being utilized as the operational voltage for the logic control, where the voltage divider divides the bias to power the logic control 113 to a specific voltage level. In the exemplary embodiment, the logic control 113 controls the switch 111 as to establish or disable the loop through path. For example, the logic control 113 may output an enable signal to turn on the switch according to a power status and configuration of the first turner 100.

In the exemplary embodiment, the logic control 113 may monitor an internal power (or the standalone power supply) supply of the first tuner 100, or a status of a low noise amplifier (not shown in FIG. 2, and shown in FIG. 3) of the first tuners 100. For example, when detecting the internal power supply is available or enabled, which supplies operational voltage to various electronic components in the first tuner 100, and the low noise amplifier is enabled, the logic control 113 would turn off the switch 111 since an internal power may be utilized to power an active loop through circuit of the first tuner 100 (which would be described later). On the other hand, when detecting the internal power supply is not available or the low noise amplifier is disabled, the logic control 113 would output the enable signal which turns on the switch 111 by utilizing the bias received from the second tuner 200 through the output terminal 102.

The logic control 113 is configured to execute a plurality of logic gates or control commands which are implemented in a hardware form or in a firmware form, so as to execute various operations described above.

In the exemplary embodiment, the switch 111 may be implemented in a low-cost COMS technology fully integrated altogether with the first tuner 100, such as by a thin oxide transistor. However, the exemplary embodiment is not intended to limit the type of the switch. Any switches that may be utilized to achieve the above operation without departing from the spirit of the invention.

Based on the above configuration, the logical control 113 of the first tuner 110 may still obtain sufficient operational voltage from the subsequent tuner through the output terminal 102 even when the first tuner 100 is not powered by the standalone power supply. In such manner, the loop through circuit 110 of the first tuner 110 may still loop through the received RF signal to the second tuner 200 by using the bias received from the second tuner 200 via the output terminal 102.

In the exemplary embodiment, the bias provided by the second tuner 200 may be between 13 and 18 volts generated by an integrated receiver/decoder (IRD) (not shown) in the second tuner 200, where the bias may be fed to an input terminal of the subsequent terminal through a choke inductance (not shown). And the divided bias may be around 1.2 volts. As a result, the potential at the input terminal of the second tuner 200 is fed to output the output terminal 102 of the first tuner 110.

The first tuner 100 may include an ESD circuit connected to the output terminal 101 to protect the internal circuitry of the first tuner 100. The exemplary first tuner 100 may utilize the ESD circuit to protect the first tuner 100 from electrostatic discharges. In the exemplary embodiments, the ESD circuit includes anti-parallel diodes.

Figure 3:
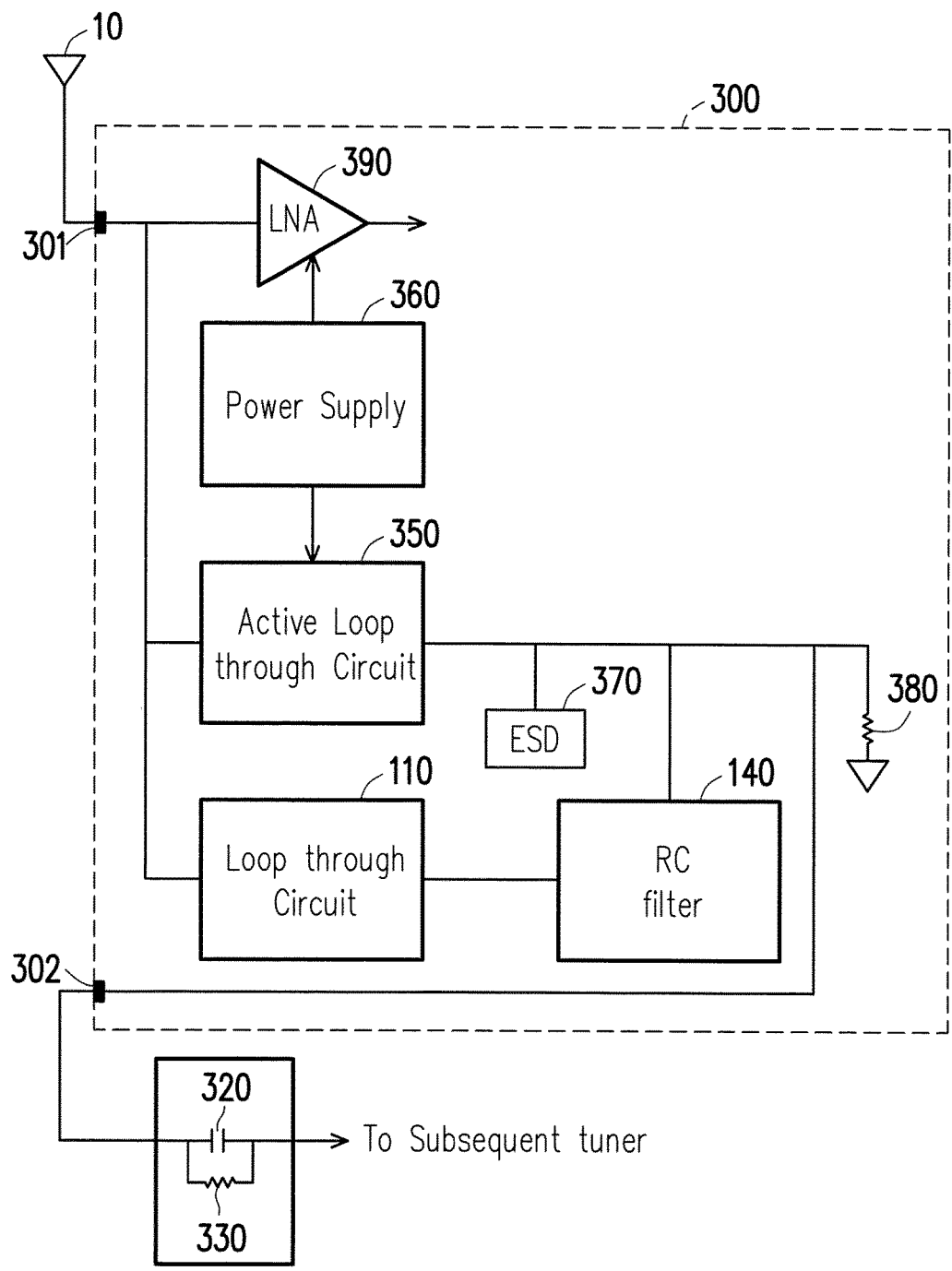
FIG. 3 is a block diagram illustrating a tuner 300 receiving a RF signal from the antenna 10 according to one of the embodiments of the disclosure.

FIG. 3 is a block diagram illustrating a tuner 300 receiving a RF signal from the antenna 10 according to one of the embodiments of the disclosure. With reference to FIG. 3, the tuner 300 includes an input terminal 301, a loop through circuit 310 (as referred to as zero power loop through circuit), RC circuit filter 140, an internal resistor 380, and a low noise amplifier (LNA) 390. As compared to the first tuner 100 illustrated in FIG. 1, the tuner 300 further includes an active loop through circuit 350, a power supply 360, and an ESD circuit 370. The power supply 360 supplies an internal power to various components in the tuner 300, for example, the low noise amplifier (LNA) 390 and an active loop through circuit 350. Furthermore, in the exemplary embodiment, a capacitor 320 and a resistor 330 may be external to the tuner 300 and coupled to the output terminal 302. However, it should be noted that the capacitor 320 and the resistor 330 may be internal to the tuner 300 in other embodiments, the disclosure is not intended to limit the location of the capacitor 320 and the resistor 330.

The active loop through circuit 350 is powered by the power supply 360 to provide a loop through path in the tuner 300 to bypass the received RF signal to the subsequent tuner coupled to the output terminal 302. As described above, the logic control 113 monitors the internal power and the status of LNA 390, as to determine whether to turn on the switch 111 as to enable the zero power loop through circuit 110. In other words, the logic control 113 determines whether to output the enable signal according to the internal power and status of the LNA 390 of the tuner 300. Under a condition where the active loop through circuit 350 is powered by the supply 360 and the LNA 390 is enabled, the logic control 113 would disable the zero power loop through circuit 110 by turning off the switch 111. On the other hand, if the power supply 360 is turned off for any reason, such as unplugged from a power outlet or a standalone power, or the LNA 390 is disabled, the logic control 113 would enable the zero power loop through circuit 110 by turning on the switch 111 which establishes the loop through path through the zero powerloop through circuit 110.

In one of the exemplary embodiments, the zero power loop through circuit 110 may be enabled according to an operational status of disabling the LNA 390. For example, a power outage of the tuner 300 would also cause the LNA 390 to be disable, and the logic control 110 may also monitor the status of the power supply 350 according to the operational state of the LNA 390. However, the disclosure is not intended to limit to condition of disabling the LNA 390. In one of the exemplary embodiments, the LNA 390 may be intentionally disabled. When the logic control 110 detects that the LNA 390 is disabled, the logic control 110 would turn on the switch 111 as to enable the zero power loop through circuit 110 regardless of whether the internal power is detected or not.

In the exemplary embodiment, active loop through circuit 350 is enabled when the LNA 390 is enabled. On the country, the active loop through circuit 350 is disabled when the LNA 390 is disabled either.

In summary, the exemplary embodiments described above depicted a tuner circuit having a loop through circuit that utilizes a bias found at the output terminal connected to a subsequent tuner circuit to turn on or off a switch for enabling or disabling a loop through path that bypass a received RF signal to the subsequent tuner circuit. Therefore, even when the tuner circuit is not powered, the logic control would have sufficient power to turn on a switch to provide the loop through path which delivers the received RF signal to the subsequent tuner circuit.

Although the present invention has been described with reference to the above embodiments, it will be apparent to one of ordinary skill in the art that modifications to the described embodiments may be made without departing from the spirit of the invention. Accordingly, the scope of the invention will be defined by the attached claims and not by the above detailed descriptions.

Exemplary embodiments of the present invention, described herein, include various operations. These operations may be performed by hardware components, software, firmware, or a combination thereof. As used herein, the term "coupled to" may mean coupled directly or indirectly through one or more intervening components. Any of the signals provided over various buses described herein may be time multiplexed with other signals and provided over one or more common buses. Additionally, the interconnection between circuit components or blocks may be shown as buses or as single signal lines. Each of the buses may alternatively be one or more single signal lines and each of the single signal lines may alternatively be buses.

Exemplary embodiments of the present disclosure may comprise any one or more of the novel features described herein, including in the Detailed Description, and/or shown in the drawings. As used herein, "at least one," "one or more" and "and/or" are open-ended expressions that are both conjunctive and disjunctive in operation. For example, each of the expressions "at least one of A, B and C," "at least one of A, B, or C," "one or more of A, B, and C," "one or more of A, B, or C" and "A, B, and/or C" means A alone, B alone, C alone, A and B together, A and C together, B and C together, or A, B and C together. It is to be noted that the term "a" or entity refers to one or more of that entity. As such, the terms "a" (or "an"), "one or more" and "at least one" can be used interchangeably herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A tuner circuit, comprising:
an input terminal, receiving a radio frequency signal;
an output terminal, connected to an immediately subsequent tuner circuit and outputting the radio frequency signal to the immediately subsequent tuner circuit;
a loop through circuit, connected between the input terminal and the output terminal; and
an internal resistor, connected between the output terminal and a ground terminal, wherein the internal resistor and an external resistor form a voltage divider to divide a voltage received from the immediately subsequent tuner circuit through the same output terminal that outputs the radio frequency signal to the immediately subsequent tuner to generate a divided voltage, wherein the external resistor are external to the tuner circuit and the immediately subsequent tuner circuit and the external resistor is directly connected between the tuner circuit and the immediately subsequent tuner circuit, wherein the loop through circuit comprises a logic control, connected to the output terminal to obtain the divided voltage, and outputting a control signal according to a power status of the tuner circuit, wherein, in response to detecting that internal power supply of the tuner circuit is not available or a low noise amplifier of the tuner circuit is disabled, the control logic is powered by the divided voltage for providing a loop through path to deliver the radio frequency signal received from the input terminal to the immediately subsequent tuner circuit through the same output terminal that also receives the voltage from the subsequent tuner.

2. The tuner circuit of claim 1, wherein the loop through circuit further comprises a switch having a first terminal connected to the input terminal, a second terminal connected to the output terminal, and a control terminal connected to the logic control, and forming the loop through path between the input terminal and the output terminal according to the control signal.

3. The tuner circuit of claim 2, the logic control detects the internal power supply by determining the power status of the tuner circuit by monitoring a standalone power for providing operational power to the tuner circuit and determining configuration of the tuner circuit by monitoring a status of the low noise amplifier of the tuner circuit.

4. The tuner circuit of claim 3, wherein the logic control turns off the switch when the low noise amplifier is enabled or the tuner circuit is powered by the standalone power.

5. The tuner circuit of claim 3, wherein the logic control turns on the switch when the low noise amplifier is disabled or the tuner circuit is not powered by the standalone power.

6. The tuner circuit of claim 2, wherein the switch is a thin oxide transistor.

7. The tuner circuit of claim 3, further comprising:
a power supply, receiving power from the standalone power to supply power for the tuner circuit;
an active loop through circuit connected between the input terminal and the output terminal, delivering the radio frequency signal from the input terminal to the output terminal when the tuner circuit is powered by the power supply; and
a ESD circuit, connected between an output of the active loop through circuit and the ground terminal.

8. The tuner circuit of claim 7, wherein the active loop through is disabled when the low noise amplifier is disabled.

9. The tuner circuit of claim 1, wherein the loop through circuit is integrated with the tuner circuit using CMOS process.

10. The tuner circuit of claim 1, the radio frequency signal is in a range of 950 MHz to 2.15 GHz.

11. A loop through circuit, embedded in a tuner, comprising:
an input terminal, receiving a radio frequency signal;
an output terminal, outputting the radio frequency signal to a subsequent tuner immediately subsequent to the tuner via a first resistor, and receiving a voltage from the subsequent tuner via the first resistor, wherein the first resistor and a second resistor form a voltage divider to divide the received voltage to generate a divided voltage, and the first resistor is external to the tuner and the first resistor is directly connected between the tuner and the subsequent tuner, the second resistor is internal to the tuner;
a logic control, connected to the output terminal, receiving the divided voltage through the voltage divider and outputting a control signal in response to detecting of internal power supply of the tuner not being available or a low noise amplifier of the tuner is disabled by using the divided voltage; and a switch, connected between the input terminal and the output terminal, receiving the control signal outputted from the logic control, and providing a loop through path for the radio frequency signal received from the input terminal to be delivered to the output terminal according to the control signal for outputting the radio frequency signal to the subsequent tuner.

12. The loop through circuit of claim 11, further comprising a RC filter connected between the output terminal and the logic control.

13. The loop through circuit of claim 11, wherein the switch is a thin oxide transistor.

14. The loop through circuit of claim 11, the radio frequency signal is in a range of 950 MHz to 2.15 GHz.

15. A video broadcasting system, comprising:

a first tuner, receiving a radio frequency signal from a transceiver, comprising a first terminal, a second terminal, an internal resistor connected between the second terminal and a ground terminal, and a loop through circuit connected between the first terminal and second terminal, and delivering the radio frequency signal received from the first terminal to the second terminal via the loop through circuit; and a second tuner, comprising an input terminal connected to the second terminal of the first tuner, the second tuner receives the radio frequency signal from the first tuner and provides a voltage to the first tuner through the input terminal, the second tuner is connected immediately subsequent to the first tuner; and an external resistor, directly connected between the first tuner and the second tuner, wherein the internal resistor and the external resistor generate a divided voltage based on the voltage provided by the second tuner, wherein the loop through circuit of the first tuner comprises:

a logic control, connected to the internal resistor to obtain the divided voltage as operational power and in response to detecting of internal power supply of the first tuner not being available or a low noise amplifier of the first tuner being disabled, outputting a control signal for providing a loop through path for delivering the radio frequency signal received from the transceiver to the second tuner according to the control signal.

16. The video broadcasting system of claim 15, wherein the loop through circuit further comprises: a switch connected between the first terminal and the second terminal, having a control terminal connected to the logic control, and providing the loop through path to deliver the radio frequency signal from the transceiver to the second tuner according to the control signal.

17. The video broadcasting system of claim 16, wherein the logic control generates the control signal to turn on the switch providing the loop through path when the first tuner circuit is not powered by a standalone power or the low noise amplifier of the first tuner circuit is not enabled.

18. The video broadcasting system of claim 16, wherein the loop through circuit further comprising a RC filter connected between the second terminal and the logic control.

19. The video broadcasting system of claim 16, wherein the switch is a thin oxide transistor.

* * * * *